US012699826B2

(12) United States Patent
Hébert et al.

(10) Patent No.: US 12,699,826 B2
(45) Date of Patent: Aug. 4, 2026

(54) POWER PREDICTION AND CIRCUIT DESIGN METHODS

(71) Applicant: Arm Limited, Cambridge (GB)

(72) Inventors: Nicolas Christophe Hébert, Valbonne (FR); Shidhartha Das, Upper Cambourne (GB)

(73) Assignee: Arm Limited, Cambridge (GB)

( * ) Notice: Subject to any disclaimer, the term of this patent is extended or adjusted under 35 U.S.C. 154(b) by 767 days.

(21) Appl. No.: 17/902,810

(22) Filed: Sep. 3, 2022

(65) Prior Publication Data

US 2024/0095430 A1 Mar. 21, 2024

(51) Int. Cl.
| *G06F 30/327* | (2020.01) |
| *G06F 30/27* | (2020.01) |
| *G06F 30/3308* | (2020.01) |

(52) U.S. Cl.
CPC ............ *G06F 30/327* (2020.01); *G06F 30/27* (2020.01); *G06F 30/3308* (2020.01)

(58) Field of Classification Search
USPC ........................................ 716/104
See application file for complete search history.

(56) References Cited

U.S. PATENT DOCUMENTS

| 8,650,413 | B2 | 2/2014 | Bose et al. |
| 10,909,283 | B1 | 2/2021 | Wang et al. |
| 11,320,883 | B2 * | 5/2022 | Baskaran .............. G06F 1/3203 |
| 11,726,116 | B2 | 8/2023 | Xu et al. |

| 11,959,950 | B2 | 4/2024 | Xu et al. |
| 2006/0277509 | A1 | 12/2006 | Tung et al. |
| 2008/0092092 | A1 | 4/2008 | Dalton et al. |
| 2009/0271167 | A1 | 10/2009 | Zhu et al. |
| 2010/0268930 | A1 | 10/2010 | Bose et al. |
| 2011/0047402 | A1 | 2/2011 | Carney |
| 2012/0036375 | A1 | 2/2012 | Puschini Pascual et al. |
| 2014/0013294 | A1 * | 1/2014 | Berkovitz .............. G06F 30/33 |
| | | | 716/133 |
| 2015/0295410 | A1 | 10/2015 | Hooshmand et al. |
| 2017/0018923 | A1 | 1/2017 | Rombouts |

(Continued)

OTHER PUBLICATIONS

Xie, et al.; APOLLO: An Automated Power Modeling Framework for Runtime Power Introspection in High-Volume Commercial Microprocessors; MICRO '21, MICRO-54, 54th Annual IEEE/ACM International Symposium on Microarchitecture; Oct. 2021.

(Continued)

*Primary Examiner* — Bryce M Aisaka
(74) *Attorney, Agent, or Firm* — Pramudji Law Group PLLC; Ari Pramudji

(57) ABSTRACT

According to one implementation of the present disclosure, a method includes: receiving, by a hardware design generation circuit, a plurality of input signals of a software workload on a processing unit; training a power prediction model based on a toggling of the input signals accumulated over a training interval range; determining, by the hardware design generation circuit, a plurality of prediction proxies and respective weightings for the plurality of prediction proxies based at least partially on the trained power prediction model, wherein the plurality of weighted prediction proxies correspond to a power output of the hardware design generation circuit; and generating an updated circuit design of the processing unit based on the power output.

12 Claims, 7 Drawing Sheets

(56) References Cited

U.S. PATENT DOCUMENTS

| | | |
|---|---|---|
| 2019/0029600 A1 | 1/2019 | Hutchinson |
| 2020/0068680 A1 | 2/2020 | Neudorf et al. |
| 2020/0134363 A1 | 4/2020 | Hubenig |
| 2021/0109908 A1 | 4/2021 | Patil et al. |
| 2021/0158155 A1 | 5/2021 | Zhang et al. |

OTHER PUBLICATIONS

Xiao, et al.; VDPred: Predicting Voltage Droop for Power-Effient 3D Multi-core Processor Design; 2021 13th International Conference on Computer and Automation Engineering (ICCAE); Mar. 2021.

Xie, et al.; Fast IR Drop Estimation with Machine Learning; 2020 IEEE/ACM International Conference on Computer Aided Design (ICCAD); Nov. 2020.

Schrom, et al.; Efficiency Measurement Method for Fully Integrated Voltage Regulators used in 4th and 5th Generation Intel® Core™ Microprocessors; 2019 IEEE International Test Conference (ITC); pp. 1-6; Nov. 2019.

Ye, et al.; On-Chip Voltage-Droop Prediction Using Support-Vector Machines; 2014 IEEE 32nd VLSI Test Symposium (VTS); Apr. 2014.

Burton, et al.; FIVR—Fully integrated voltage regulators on 4th generation Intel® Core™ SoCs,; 2014 IEEE Applied Power Electronics Conference and Exposition—APEC 2014; pp. 432-439; Mar. 2014.

Sturcken, et al.; A 2.5D Integrated Voltage Regulator Using Coupled-Magnetic-Core Inductors on Silicon Interposer Delivering 10.8A/mm²; 2012 IEEE International Solid-State Circuits Conference; pp. 400-402; Apr. 2012.

Reddi, et al.; Predicting Voltage Droops Using Recurring Program and Microarchitectural Event Activity; IEEE Micro; vol. 30, No. 1: pp. 110-110, Jan. 2010.

James, et al.; Comparison of Split-Versus Connected-Core Supplies in the Power6 Microprocessor; 2007 IEEE International Solid-State Circuits Conference. Digest of Technical Papers; Feb. 2007.

Chen, et al.; Power Supply Noise Analysis Methodology for Deep-submicron Vlsi Chip Design; Proceedings of the 34th Design Automation Conference; IEEE; Jun. 1997.

Kim, et al.; Simmani: Runtime Power Modeling for Arbitrary RTL with Automatic Signal Selection; Proceedings of the 52nd Annual IEEE/ACM International Symposium on Microarchitecture (MICRO '52); Association for Computing Machinery; pp. 1050-1062; Oct. 19, 2019. https://doi.org/10.1145/3352460.3358322.

Zhou, et al.; PRIMAL: Power Inference using Machine Learning; Proceedings of the 56th Annual Design Automation Conference 2019 (DAC '19); Association for Computing Machinery; Article 39; pp. 1-6; Jun. 2, 2019. https://doi.org/10.1145/3316781.3317884.

PARR; Logic Designer's Handbook: Circuits and Systems (2nd ed.); BH Newnes; Chapter 8; 1993.

PARR; Logic Designer's Handbook: Circuits and Systems (2nd ed.); BH Newnes; Chapter 7; 1993.

* cited by examiner

Train the ML model: $F(X) = y_{pred}$

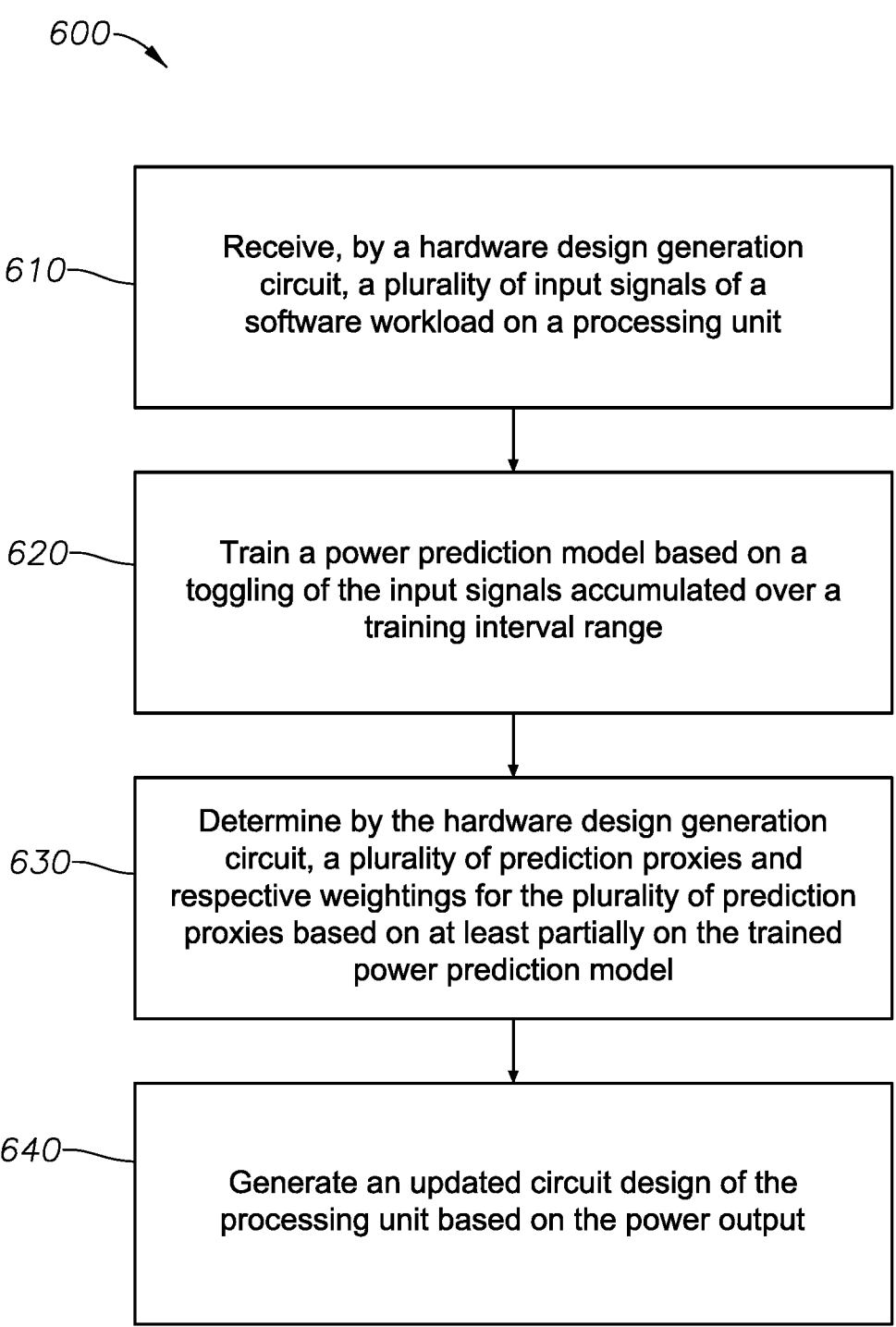

600

610 — Receive, by a hardware design generation circuit, a plurality of input signals of a software workload on a processing unit 620 — Train a power prediction model based on a toggling of the input signals accumulated over a training interval range 630 — Determine by the hardware design generation circuit, a plurality of prediction proxies and respective weightings for the plurality of prediction proxies based on at least partially on the trained power prediction model 640 — Generate an updated circuit design of the processing unit based on the power output

FIG. 6

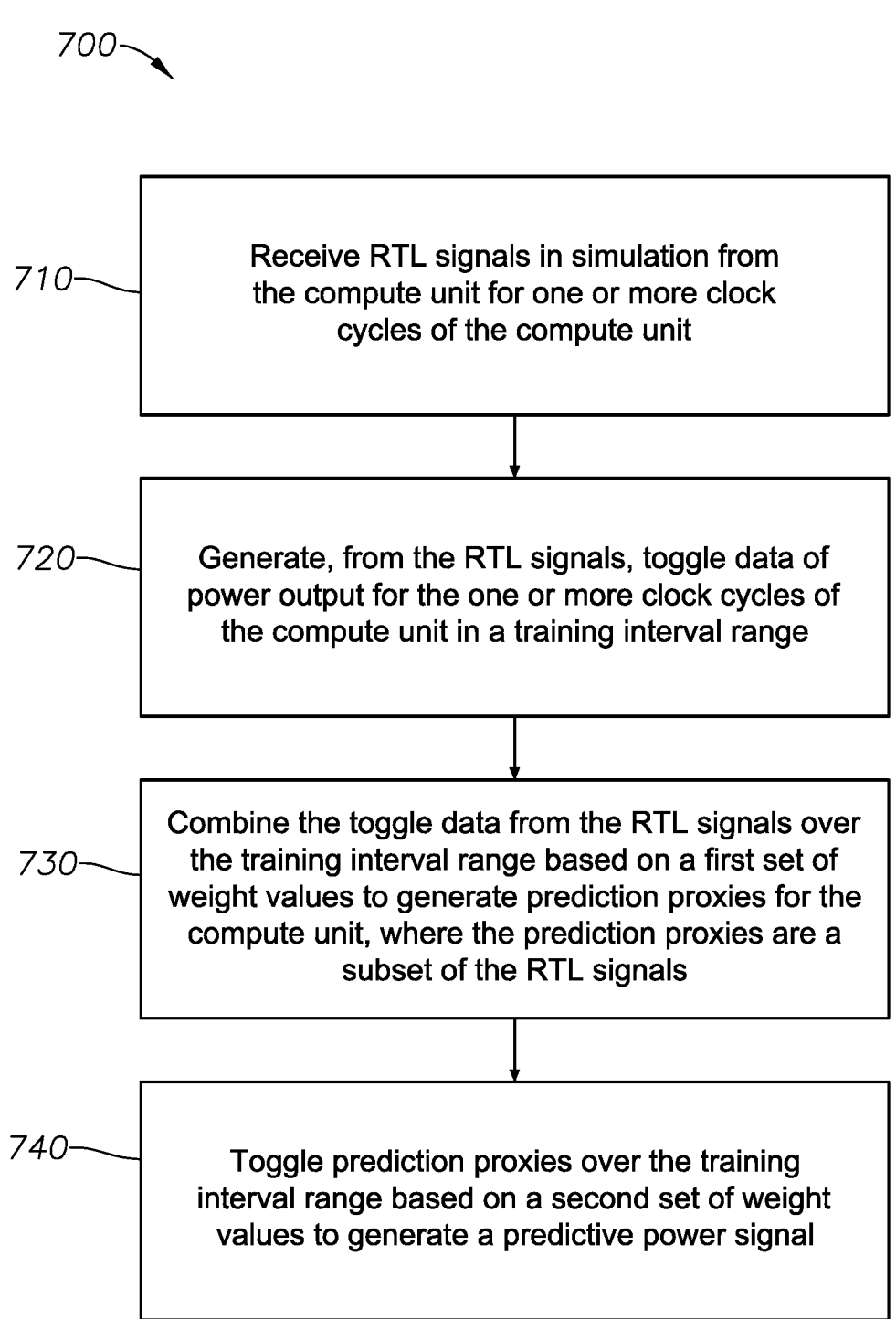

700

710 — Receive RTL signals in simulation from the compute unit for one or more clock cycles of the compute unit 720 — Generate, from the RTL signals, toggle data of power output for the one or more clock cycles of the compute unit in a training interval range 730 — Combine the toggle data from the RTL signals over the training interval range based on a first set of weight values to generate prediction proxies for the compute unit, where the prediction proxies are a subset of the RTL signals 740 — Toggle prediction proxies over the training interval range based on a second set of weight values to generate a predictive power signal

FIG. 7

POWER PREDICTION AND CIRCUIT DESIGN METHODS

I. FIELD

The present disclosure is generally related to power prediction systems, circuitry and methods thereof.

II. DESCRIPTION OF RELATED ART

Advances in technology have resulted in smaller and more powerful computing devices. For example, a variety of personal computing devices, including wireless telephones, such as mobile and smart phones, gaming consoles, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. However, for such devices, there is an ever-increasing demand for greater area efficiency for memory storage capacity and read/write capabilities. For instance, large memories or caches are required by state-of-the-art microprocessors to fulfill such demands in modern applications.

Voltage droop is an un-intentional loss in output voltage from a device as it drives a load (e.g., a software workload). When such a load is suddenly increased (e.g., experiencing a transient), the output voltage would momentarily sag. For example, due to an increase in current demand from software workloads, hardware would be unable to maintain supply voltage at a sustainable level. Conversely, when a heavy load is suddenly disconnected, voltage would show a peak. Even during extreme load transients, current-day compute-units can tolerate only a few tens of milli-volts variation, otherwise hardware circuitry become slower in operation. To account for this situation, a circuit designer (e.g., a user) may include a static margin to the system such that if the circuit does indeed get slower due to the supply voltage droop, there would be built-in sufficient "slack" within the system such that timing requirements may be met. However, static margin can be expensive, as it costs the user in power and performance.

To mitigate critical-path timing impact of voltage-droops, current solutions are based on feedback-control, and therefore, inevitably, suffer from an unavoidable response latency. For example, present day solutions utilize reactive voltage mitigation. where the power supply rail may be monitored for voltage droops (e.g. where voltage droops would be defined whether the supply rail falls below a certain threshold). Consequently, when such droop events occur, the clock input to the circuit design would be stretched to resolve the issue. However, such solutions lose its effectiveness when very large droops appear in a system that occur at a rapid rate (e.g., where voltage droops develop in just a few cycles). Correspondingly, when this rate of change occurs, the clock stretching strategy inherently has a response latency. Inevitable, due to response latency, three-to-four cycles of operation would be lost, and further, when voltage is drooping at such fast rate, the loss of these 3-4 cycles, can translate to very large static margins, and the problem would persist.

As an example, upon detection of a voltage droop event, an adaptive-clocking technique relies on a momentary relaxation of the computer processing unit (CPU) frequency. However, such an adaptive-clocking technique has a response latency of at least two-to-three CPU cycles. As discussed, for instance, when a voltage-droop is "deep" (e.g., having relatively large static-margin) and occurring at a relatively fast rate (e.g., dv/dt is relatively high), the response-latency would render such a technique ineffective. An integrated voltage regulator (IVR) is similarly ineffective because it also suffers from latency due to feedback control despite providing relatively fast and fine-grained response to voltage noise. Hence there is a need in the art for voltage mitigation solutions that are not rendered inadequate due to response-latency.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

FIG. 6 is an operation method in accordance with various implementations described herein.

FIG. 7 is an operation method in accordance with various implementations described herein.

Figure 1:
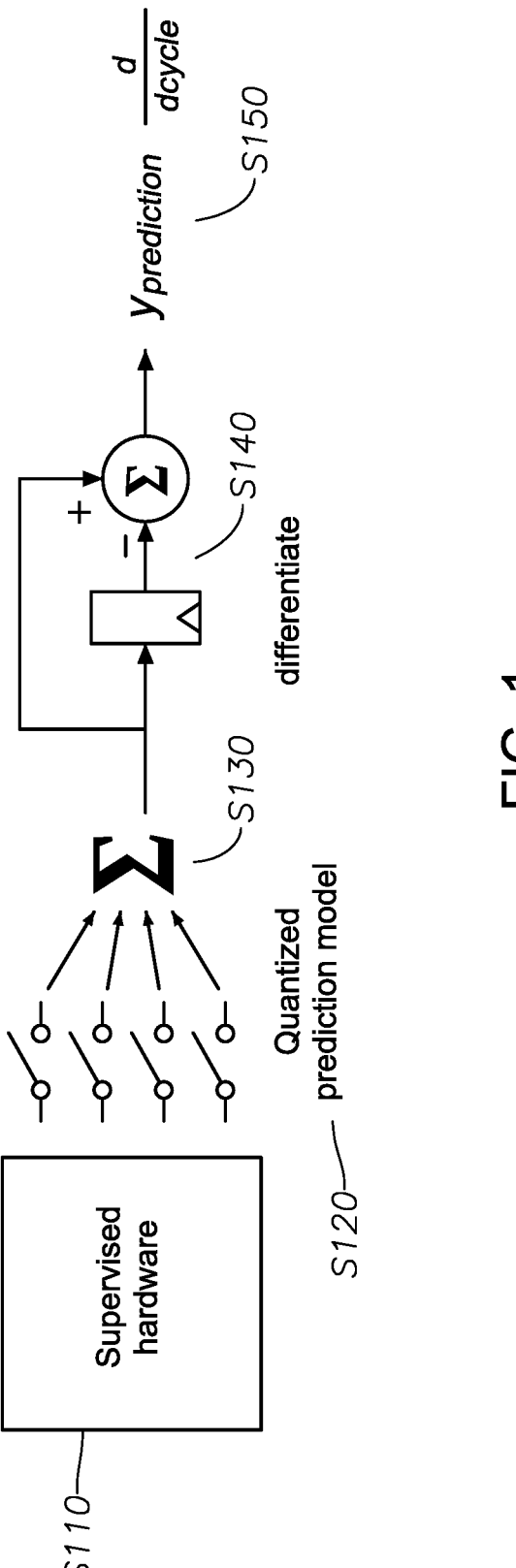
FIG. 1 is a diagram in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

According to one implementation of the present disclosure, a method includes: receiving, by a hardware design generation circuit, a plurality of input signals of a software workload on a processing unit; training a power prediction model based on a toggling of the input signals accumulated over a training interval range; determining, by the hardware design generation circuit, a plurality of prediction proxies and respective weightings for the plurality of prediction proxies based at least partially on the trained power prediction model, wherein the plurality of weighted prediction proxies correspond to a power output of the hardware design generation circuit; and generating an updated circuit design of the processing unit based on the power output.

According to one implementation of the present disclosure, an integrated circuit includes power prediction circuitry configured to receive input register-transfer level (RTL) signals from a processing unit and output a power output corresponding to a predicted power in one or more subsequent clock cycles of the processing unit.

According to one implementation of the present disclosure, a method for power prediction of a compute unit of a computer system comprises: in a power predictor circuit of the computer system: receiving register-transfer level (RTL) signals in simulation from the compute unit for one or more clock cycles of the compute unit; generating, from the RTL signals, toggle data of power output for the one or more clock cycles of the compute unit in a training interval range; combining the toggle data from the RTL signals over the training interval range based on a first set of weight values to generate prediction proxies for the compute unit, where the prediction proxies are a subset of the RTL signals from the compute unit; and toggling prediction proxies over the training interval range based on a second set of weight values to generate a predictive power signal.

Advantageously, inventive aspects of the present invention utilize machine-learning and data-science to train a power prediction model and utilize such a prediction model to optimize hardware design. In certain implementations, inventive schemes and techniques, as described herein, for the capacity of an "on-chip power demand predictor".

Schemes and techniques of the present invention relate to an embedded hardware module that enables the prediction (e.g., several cycles in advance) of current and/or voltage demand and variations in the current-demand (i.e., di/dt) and/or voltage demand (i.e., dv/dt) of a compute unit. For example, advantageously, instead of reacting to supply voltage (e.g., such as a droop event), inventive schemes and techniques react to the cause of the supply voltage droop which is an increase in current step, and the capacity to predict the current set ahead of time allows for the system to prepare and handle a voltage droop event. Hence, the inventive power demand predictor can be used to adapt a behavior of circuity when critical consumption cases would arise. More broadly, the inventive aspects provide solutions that can anticipate voltage-noise conditions and improve efficacy in combination with other solutions.

In certain implementations, by having the capability to react to current demand (rather than that of voltage), inventive aspects further allow for the capacity to predict current demand ahead of time. Hence, in being able to anticipate such situations ahead of time, response latency of mitigation mechanisms may be concealed.

Referring to FIG. 1, an example diagrammatic representation 100 according to example implementations is shown. As depicted, the representation 100 illustrates the generation of optimized supervised hardware. In certain implementations, in step 110 (S110), input signals from supervised hardware (i.e., targeted hardware template) (e.g., compute unit, processing unit (e.g., a computer processing unit (CPU) core, a graphical processing unit (GPU))) are provided to a quantized prediction model. In various operations, in step 120 (S120), the model can determine weightings (i.e., weights) and/or proxies (e.g., weighting added or not depending on a signal switch). At step 130 (S130), the output of the model may be summed (i.e., combined). For instance, the summation may include the average number of cycles the training may be configured to run. At step 140 (S140), one or more computation(s) may be performed of differential current (and/or differential voltage). For example, the differential current may be the current from a cycle immediately previous to a current cycle (e.g., the computation of a delta increase of current). Advantageously, in various implementations, as the determination of an acceleration of current change and voltage droop is significant, the inclusion of the differentiate block allows for the capability to mitigate such droop. At step 150 (S150), a predicted power ($p_{prediction}$ $_{(d/dcycle)}$) may be determined and utilized such that power optimized hardware template of the supervised hardware can be generated.

Accordingly, inventive aspects allow for the capacity to predict power usage. Advantageously, in certain implementations, the resultant output signal would be a power estimator that can output and subtract from a previous cycle's power estimator output. Hence, in certain aspects, the result would include a measure of prediction in di/dt (i.e., change in current/cycle) or dv/dt (i.e., change in voltage/cycle) that can be directly utilized (as discussed in below paragraphs).

Figure 2:
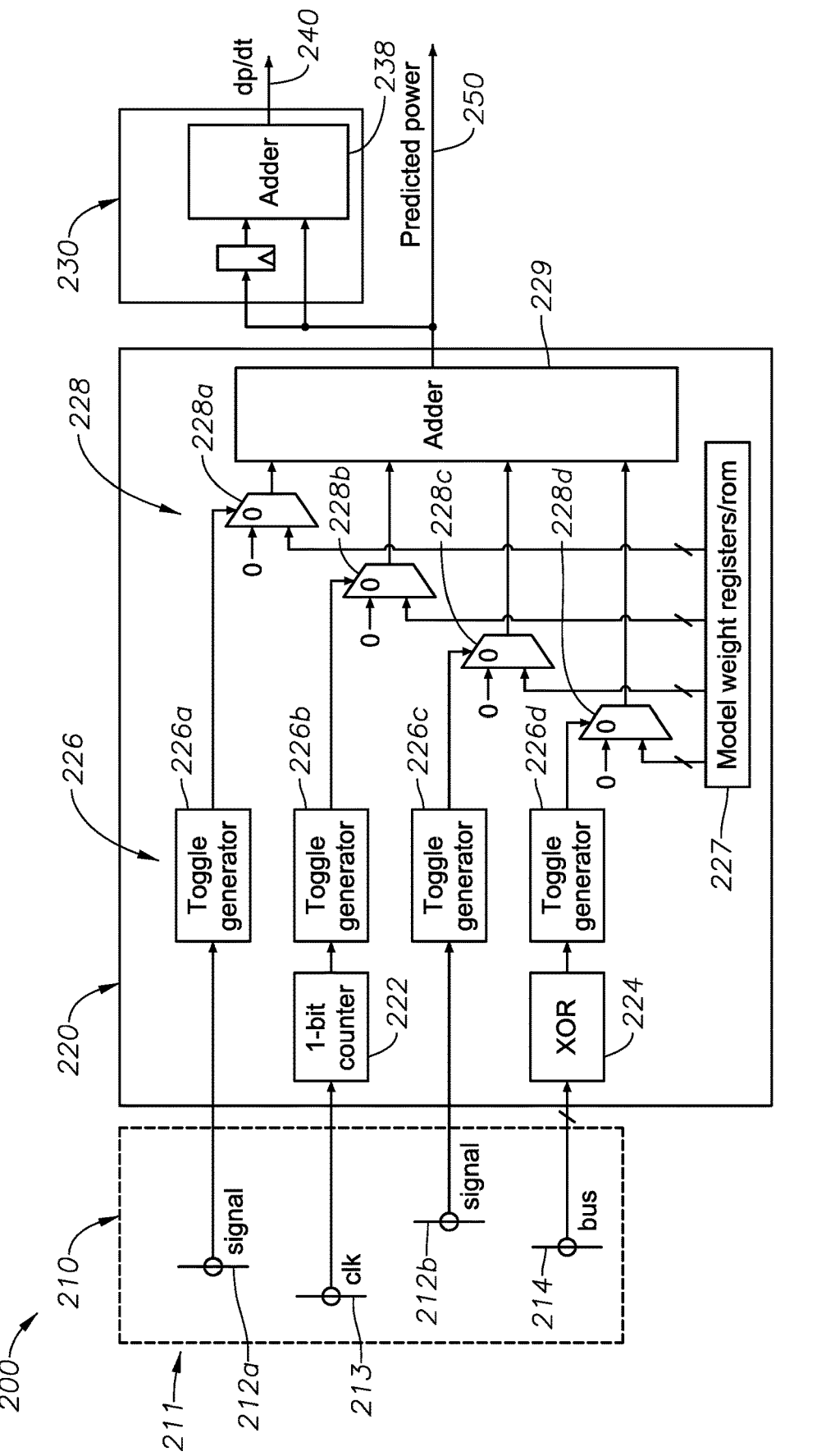
FIG. 2 is a diagram of a portion of an example integrated circuit in accordance with various implementations described herein.

Referring to FIG. 2, a partial diagrammatic representation of an integrated circuit 200 is shown according to example implementations. As illustrated, the integrated circuit 200 (e.g., an on-chip power predictor circuit) is a circuit implementation of the representation 100 in FIG. 1. The circuit 200 may include a processing unit 210 (i.e., supervised hardware/targeted hardware template) (e.g., compute unit, a computer processing unit (CPU) core, a hardware design generation circuit 220 (i.e., On-Chip Power-Demand Predictor (OPDP) circuit, On-Chip Power Predictor (OPP) embedded hardware module, power prediction circuitry), and a computation differentiation circuit (i.e., OPP dp/dt) 230.

In various implementations, as illustrated, the hardware design generation circuit 220 (i.e., power prediction circuitry) may be configured to receive input signals 211 (e.g., register-transfer level (RTL) signals) from a processing unit 210 and output a power output 250, 240 (e.g., predicted power 250 and a differential power output (dp/dt) 240) corresponding to a predicted power (i.e., Ypred d/dcycle) in one or more subsequent clock cycles of the processing unit 210. Specifically, in certain implementations, as illustrated, the hardware design generation circuit 220 (i.e., the power prediction circuitry) may be configured to receive a plurality of input signals 211 (i.e., input register-transfer level (RTL) signals) (e.g., one or more data signals 212a, 212b, etc., one or more clock signals (clk) 213, one or more bus signals 214, among other input signals) of an example software workload (e.g., a software workload simulation) on the processing unit 210.

As shown, the hardware design generation circuit 220 (e.g., power prediction circuitry) may include: one or more toggle generator circuitry 226 (e.g., a plurality of toggle generators 226a, 226b, 226c, 226d, etc.); respective multiplexers 228 (e.g., 228a, 228b, 228c, 228d, etc.) coupled to the one or more toggle generator circuitry 226; model weight register circuitry (i.e., model weight registers/rom) 227; and an adder circuitry 229. In certain implementations, each of the respective multiplexers 228 may be configured to combine or not combine toggle data of the one or more toggle generator circuitry 226 with respective weight values, and transmit output data to the adder circuitry 229. In addition, the adder circuitry 229 can be configured to sum the output data over one or more clock cycles of a training interval range to determine the power output (e.g., predicted power 250).

In certain implementations, the integrated circuit (i.e., on-chip power predictor circuit) 200 may include a computation differentiation circuitry 230. For example, the computation differentiation circuitry 230 can be configured to receive the power output (e.g., predicted power 250) and transmit a differential power output (dp/dt; current demand) based on the power output 250 to compute a rate of change of predicted power in dp/dt (i.e., change in power/cycle) (or di/dt (i.e., change in current/cycle) or dv/dt (i.e., change in voltage/cycle)).

Figure 3:
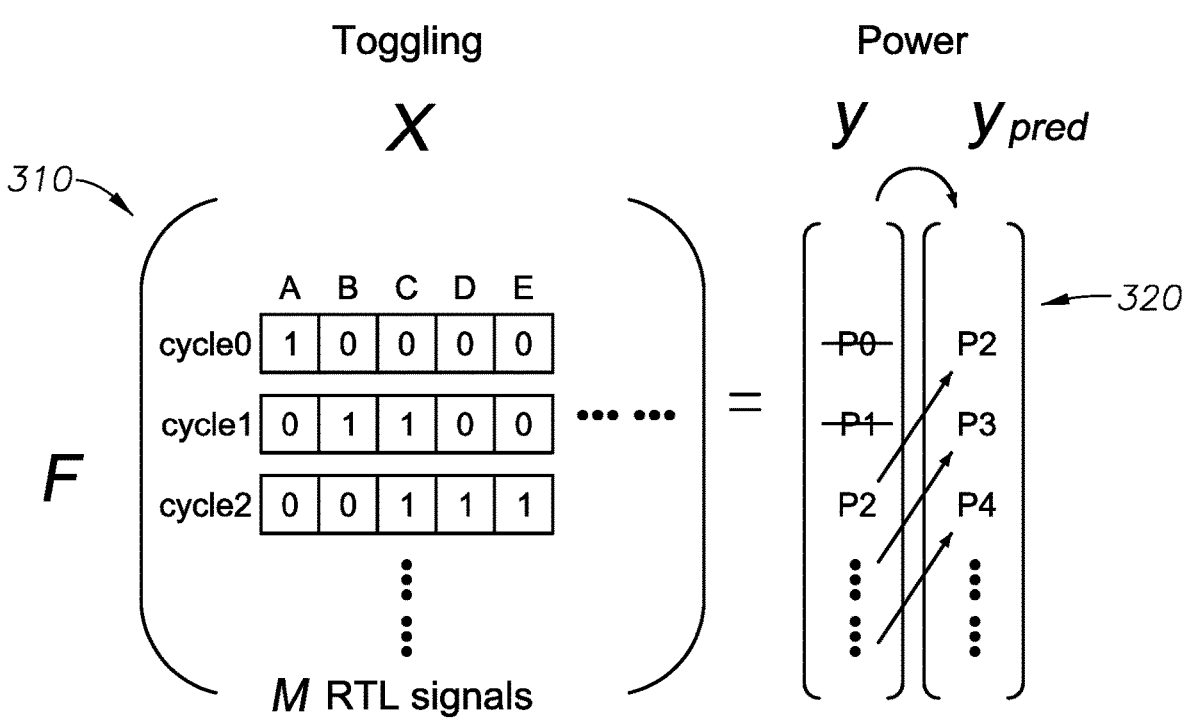
FIG. 3 is a diagram in accordance with various implementations described herein.

Referring to FIG. 3, an example representation 300 of certain inventive aspects according to example implementations is shown. As illustrated, the representation 300 illustrates a model training phase implementable in the hardware design generation circuit 220 as described herein. The model training phase includes the training of a power estimation model in predictive mode (e.g., the change from "y" to "$Y_{pred}$"). For instance, the model may be trained for each cycle against an expected future power. In certain implementations, the trained model provides an automatic model construction. Hence, advantageously, a user would merely need to provide such a tool an array of just a few thousand of power values for a given system state. Correspondingly, the inventive algorithm would select (e.g., extract) the predictive power information stored in the overall available signals. As may be appreciated, as one example, for a prediction of two cycles in advance, a power ground truth of two-cycles "ahead" (in advance) may be used.

In bock 310, an example toggling of the model ("X") training is depicted. As an example, an enumeration of all the input signals (e.g., RTL signals A", "B", "C", "D", and "E") is shown in comparison to a first, second, and third cycle (e.g., cycle0, cycle1, and cycle2). For example, all of the RTL signals would be submitted into the generation of a model, whereby a particular subset of the RTL signals would be identified and selected (e.g., prediction proxies). As may be appreciated, in the training phase, each of the submitted RTL signals may be accepted as possible candidate for identified proxies. In doing so, eventually the model may be created and configured to determine (e.g., identify) prediction proxies based on specified criteria. In certain implementations, such criteria would include RTL signals that are correlated to a predicted power. For instance, as one example, if the toggling of RTL signal "A" would cause power to increase two cycles later, then that would be used as a proxy to be compared to another signal that does not cause power to rise two cycles later. In various implementations, toggling may be defined as change from a digital "0" to a digital "1" of the input signals and vice-versa. Correspondingly, while analyzing the signal change, power readings of power consumption of the signals may be considered. In doing so, the current toggled signals in a particular clock signal would be compared to the power readings from that of two or three cycles ahead of time. Advantageously, such a trained model (e.g., a training matrix) would identify and select those signals that would be serve as useful indicators for future power, and thus, aligned with a predicted power. Accordingly, the toggling of the input signals in a first clock cycle and its respective power consumption can be used as ground truth to train the power prediction model.

In certain implementations, the training of the power prediction model would involve executing instructions that correspond to a power prediction modeling software 817 stored on a computing device 800 (as described with reference to FIG. 8). In a first step, according to the processing unit 210, the toggling of data signals for each clock cycle of a training interval range (e.g., a predetermined quantity of clock cycles) for the power prediction model can be in accordance with a temporary linear power model, such as the example shown in Eq. (1).

$$p' = \sum_{j=1}^{M} w'_j \cdot x_j \qquad (1)$$

In certain instances, for the temporary linear power model shown in Eq. (1), M corresponds to RTL signals in raw input features; w' corresponds to weights; x [i] corresponds to either the toggling of proxies at each cycle j, x, [i]∈ {0, 1}Q or the toggling of RTL signals at each cycle j, x[i]∈ {0, 1}M; and p corresponds to the predicted power at each cycle. As may be appreciated, in certain cases, such a linear power model is not trained just to minimize the prediction error in a training dataset. Instead, when minimizing the prediction error during training, the model simultaneously may shrink all weights $w'_1$, $w'_2$, . . . , $w'_M$ such that the majority of weights eventually become zero, e.g., the model becomes sparse. Hence, then only those RTL signals associated with non-zero weight terms may be selected as "power proxies."

In various implementations, in operation, the training of the power prediction model would include: generating respective toggle data signals to be performed by one or more toggle generators 226 of the hardware generation circuit 220 upon receiving the input signals 211. For example, the input signals 211 corresponds to a plurality of register-transfer level (RTL) signals in simulation (e.g., as performed by computer system 800 in certain instances); and toggling, by the one or more toggle generators 226 of the hardware generation circuit 220, the toggle data signals at each clock cycle of the training interval range as a first training step of the power prediction model (e.g., temporary linear power model).

In certain implementations, in operation the determination of the plurality of prediction proxies and the weighting of the plurality of prediction proxies include, by executing instructions corresponding to the power prediction modeling software 817 stored on the computing device 800: 1) either combining or not combining, by respective multiplexers 228 and the adder 229, the toggled data signals based on a set of trainable weight values (received from the model weight registers/ROM 227) over a predetermined training interval range as another training step of the power prediction model; 2) identifying, by the power prediction model M, a subset of the of the plurality of RTL signals comprising non-zero weight terms (i.e., that remain after the set of trainable weight values above a high-threshold percentage is approximately zero), where the subset of the of the plurality of the input signals (e.g., RTL signals) 211 correspond to a plurality of candidate prediction proxies; 3) toggling, the plurality of candidate prediction proxies; and 4) combining or not combining, by the respective multiplexers 228 and the adder 229, the plurality of candidate prediction proxies based on a second set of trainable weight values over each clock cycle of the training interval range.

In some instances, the toggled data signals may be combined (or not combined) based on a correlation of predicted power being above a predicted power threshold, and where the plurality of candidate prediction proxies may be combined or not combined based on a correlation of the prediction proxies being above a proxy threshold (e.g., a predetermined user input or machine generated quantity).

In some instances, the training of the power prediction model includes one or more of a combination of a minimax concave penalty (MCP) algorithm, pruning training model, a loss function equation, or a sparce linear model. In some instances, the power prediction model may be trained by a power simulation of the processing unit 210. In some instances, the toggling of the input signals 211 in a first clock cycle and its respective power consumption is used as ground truth to train the power prediction model. As illustrated, the model may also be trained for rate of change of power (e.g., the change from "y" to "ypred").

In block 320, the inventive power-predictor modeling output (e.g., ypred) may be translated into on-chip circuitry (e.g., the optimized hardware template). With reference to FIGS. 1-5 and 8, based on the power output (e.g., predicted power, ypred, or dp/dt), an updated (optimized) circuit design (i.e., an RTL Verilog circuit design, synthesizable verilogs built as gates in silicon, updated hardware template of CPU core, computer readable specification) of the processing unit 210 may be generated, by a logic synthesis tool (e.g., EDA tool) 817 of a computing device 800.

Figure 4:
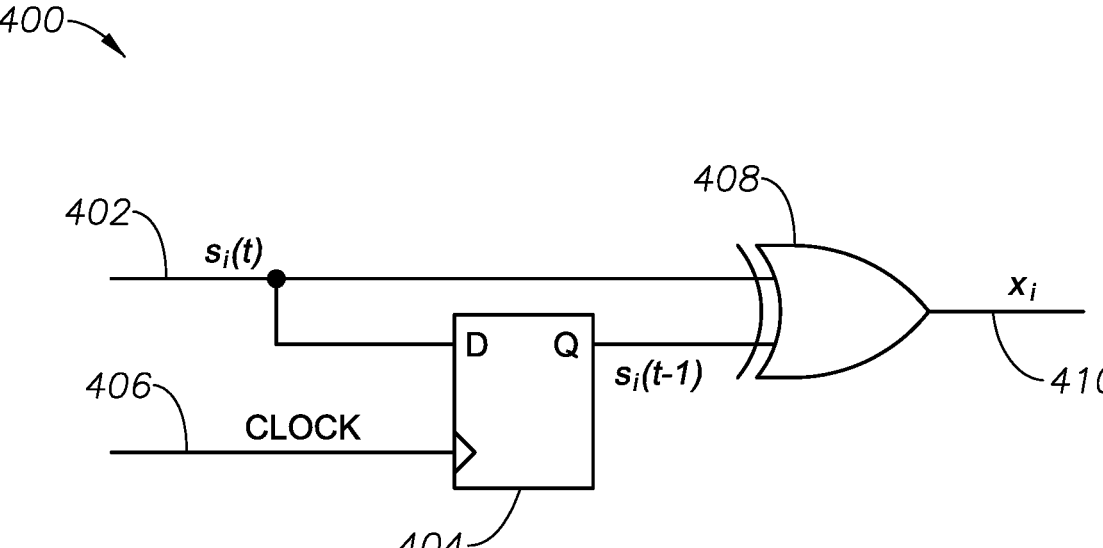
FIG. 4 is a diagram of a portion of an example circuit in accordance with various implementations described herein.

Referring to FIG. 4, an example toggle generator circuitry 400 is shown according to example implementations. In certain implementations, the toggle generator circuitry 400 may be the toggle generator circuitry 226, as illustrated with reference to FIG. 2. As depicted, each of the one more toggle generator circuitry 400 includes: a register (e.g., D-flip-flop) 404 and a logic gate 408. In operation, the logic signal si(t) 602 at time (t) is transmitted as the data input of register 604 clocked by clock signal 606. The register may be D flip-flop, for example. The output from register 604, which corresponds to the previous input signal, si(t−1), is combined in logic XOR ('exclusive or') gate 608 to produce toggle data (x$_i$) 610. In certain implementations, the register 404 can be configured to store a prior RTL signal (s$_i$(t−1)) of the processing unit 210 and the logic gate 408 can be configured to perform a logical 'exclusive or' ('XOR') operation between the prior signal (corresponding to a previous RTL signal) and a current signal (s$_i$(t)) corresponding to a current RTL signal to generate a toggled data signal (x$_i$). As shown, the toggle generator circuitry may receive the current signal (s$_i$(t)) 402 (corresponding to a current RTL signal) and a clock signal 406, and output the toggled data signal (x$_i$) 410.

Figure 5:
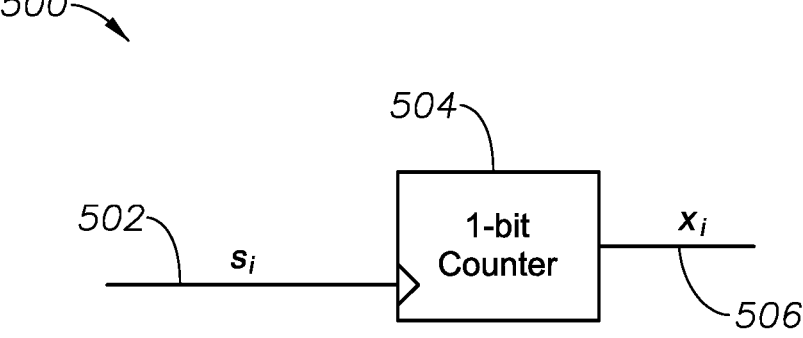
FIG. 5 is a diagram of a portion of an example circuit in accordance with various implementations described herein.

Referring to FIG. 5, an example one-bit counter circuitry 500 is shown according to example implementations. In certain implementations, the one-bit counter circuitry 500 may be the one-bit counter circuitry 222, as illustrated with reference to FIG. 2. As depicted, the one-bit counter circuitry 500 includes: a one-bit counter 504 responsive to an input logic signal (s$_i$) 502 (e.g., a clock signal) is transmitted to a one-bit counter 504 and configured to generate a toggled data signal (x$_i$) 506.

Referring to FIG. 6, a flowchart of an example operational method 600 (i.e., procedure) is shown for power prediction of a compute unit of an integrated circuit according to example implementations. Correspondingly, power and performance requirements of a computer design may be enhanced. The method 600 may be implemented with reference to implementations of the on-chip power predictor circuit as shown with reference to FIGS. 1-5, and 8.

At block 610, the method 600 includes receiving, by a hardware design generation circuit, a plurality of input signals of a software workload on a processing unit. For example, with reference to FIGS. 1 and 2, a plurality of input signals 211 (e.g., RTL signals) of a software workload simulation may be received on a processing unit 110, 210 (e.g., supervised/targeted hardware template, compute-unit, CPU core).

At block 620, the method 600 includes training, by a power simulation of the processing unit, a power prediction model based on a toggling of the input signals (on a per-cycle basis) accumulated over a training interval range. For example with reference to FIGS. 1-3, a power prediction model (based on a toggling of the input signals (on a per-cycle basis) accumulated over a training interval range) can be trained by a power simulation of the processing unit 110, 210.

At block 630, the method 600 includes determining, by the hardware design generation circuit, a plurality of prediction proxies and respective weightings for the plurality of prediction proxies based at least partially on the trained power prediction model, where the plurality of weighted prediction proxies correspond to a power output of the hardware design generation circuit. For example with reference to FIGS. 1-3, a plurality of prediction proxies and respective weightings for the plurality of prediction proxies (based at least partially on the trained power prediction model, where the plurality of weighted prediction proxies correspond to a power output 250 (i.e., predicted power, Ypred d/dcycle) of the hardware design generation circuit 220) may be determined by the hardware design generation circuit 220.

At block 640, the method 600 includes generating an updated optimized circuit design (i.e., an RTL Verilog circuit design, synthesizable verilogs built as gates in silicon, updated hardware template of CPU core, computer readable specification) of the processing unit based on the power output. For example, with reference to FIGS. 1-5 and 8, an updated optimized circuit design (i.e., an RTL Verilog circuit design, synthesizable verilogs built as gates in silicon, updated hardware template of CPU core, computer readable specification) of the processing unit 210 based on the power output 250 may be generated by a logic synthesis tool (e.g., EDA tool) 824 of a computing device 800.

In certain implementations, the method 600 includes generating, by a computation differentiation (block) circuitry (i.e., OPP dp/dt), a differential power output (dp/dt; current demand) based on the power output to compute a rate of change of the power output. For instance, with reference to FIGS. 1-5 and 8, a computation differentiation circuitry 230 can be configured to receive the power output (e.g., predicted power 250) and transmit a differential power output (dp/dt; current demand) based on the power output 250 to compute a rate of change of predicted power 240. Furthermore, in some implementations, the synthesis tool 824 may generate an updated circuit design (i.e., an RTL Verilog circuit design, synthesizable verilogs built as gates in silicon, updated hardware template of CPU core, computer readable specification) based on the differential power output 240.

In certain implementations, a software workload simulation can be designed to generate power output of the input signals (e.g., a plurality of register-transfer level (RTL) signals) in simulation. For example, the software workload simulation can be configured to allow for the training of the power prediction model. In some instances, a training interval range may include a range of one or more clock cycles (e.g., as provided by user input or computer generated for optimization) of such a power simulation of the processing unit 210.

In various implementations, the training of the power prediction model includes, by executing instruction corresponding to a power prediction modeling software stored on a computing device 800: 1) generating respective toggle data signals, by one or more toggle generators 226 of the hardware generation circuit 220, from the input signals 211, wherein the input signals 211 corresponds to a plurality of register-transfer level (RTL) signals in simulation; and 2) toggling, by the one or more toggle generators 226 of the hardware generation circuit 220, the toggle data signals at each clock cycle of the training interval range as a first training step of the power prediction model (e.g., temporary linear power model such as the example shown in Eq. (1)).

In certain implementations, the determination of the plurality of prediction proxies and the weighting of the plurality of prediction proxies comprise, by executing instructions corresponding to the power prediction modeling software stored on the computing device 800: 1) either combining or not combining, by respective multiplexers 228 and the adder 229, the toggled data signals based on a set of trainable weight values over the training interval range (e.g., predetermined clock cycle(s)) as a second training step of the power prediction model; 2) identifying, by the power prediction model, a subset of the of the plurality of RTL signals comprising non-zero weight terms (i.e., that remain after the set of trainable weight values above a high-threshold percentage is approximately zero), where the subset of the of the plurality of the input signals (e.g., RTL signals) 211 correspond to a plurality of candidate prediction proxies; 3) toggling, the plurality of candidate prediction proxies; and 4) combining or not combining, by the respective multiplexers 228 and the adder 229, the plurality of candidate prediction proxies based on a second set of trainable weight values over each clock cycle of the training interval range as a third training step of the power prediction model.

In some instances, the toggled data signals may be combined (or not combined) based on a correlation of predicted power being above a predicted power threshold, and where the plurality of candidate prediction proxies are combined or not combined based on a correlation of the prediction proxies being above a proxy threshold (e.g., predetermined quantity by user input or computer generated).

In some instances, the training of the power prediction model includes one or more of a combination of a minimax concave penalty (MCP) algorithm, pruning training model, a loss function equation, or a sparce linear model. In some instances, the power prediction model may be trained by a power simulation of the processing unit 210. In some instances, the toggling of the input signals in a first clock cycle and respective power consumption is used as ground truth to train the power prediction model.

Referring to FIG. 7, a flowchart of an example operational method 700 (i.e., procedure) is shown for power prediction of a compute unit of a computer system according to example implementations. Advantageously, in various implementations, the method 700 may flexibly account for power and performance requirements of memory architecture in real-time. The method 700 may be implemented with reference to implementations of the on-chip power predictor circuit as shown with reference to FIGS. 1-5 and 8.

At block 710, the method 700 includes: receiving, in a power predictor circuit of the computer system: register-transfer level (RTL) signals in simulation from the compute unit for one or more clock cycles of the compute unit. For example, with reference to FIGS. 1 and 2, a plurality of input signals 211 (e.g., RTL signals) of a software workload simulation may be received on a processing unit 110, 210 (e.g., supervised/targeted hardware template, compute-unit, CPU core).

At block 720, the method 700 includes: generating, from the RTL signals, toggle data of power output for the one or more clock cycles of the compute unit in a training interval range. For example with reference to FIGS. 1-3, a power prediction model (based on a toggling of the input signals (on a per-cycle basis) accumulated over a training interval range) can be trained by a power simulation of the processing unit 110, 210.

At block 730, the method 700 includes: combining the toggle data from the RTL signals over the training interval range based on a first set of weight values to generate prediction proxies for the compute unit, where the prediction proxies are a subset of the RTL from the compute unit.

At block 740, the method 700 includes: toggling prediction proxies over the training interval range based on a second set of weight values to generate a predictive power signal. For example the weight values may correspond to the likelihood of RTL signals or proxies being determined to be aligned to predicted power of subsequent RTL signals.

In certain implementations, the method 700 includes: generating, by a synthesis tool stored in memory of the integrated circuit, a computer readable specification of the compute unit based on the predictive power signal. In certain implementations, the method 700 includes: in a computation differentiation circuit of the computer system, generating a differential power output based on the predictive power signal to compute a rate of change of the predicted power signal.

Figure 8:
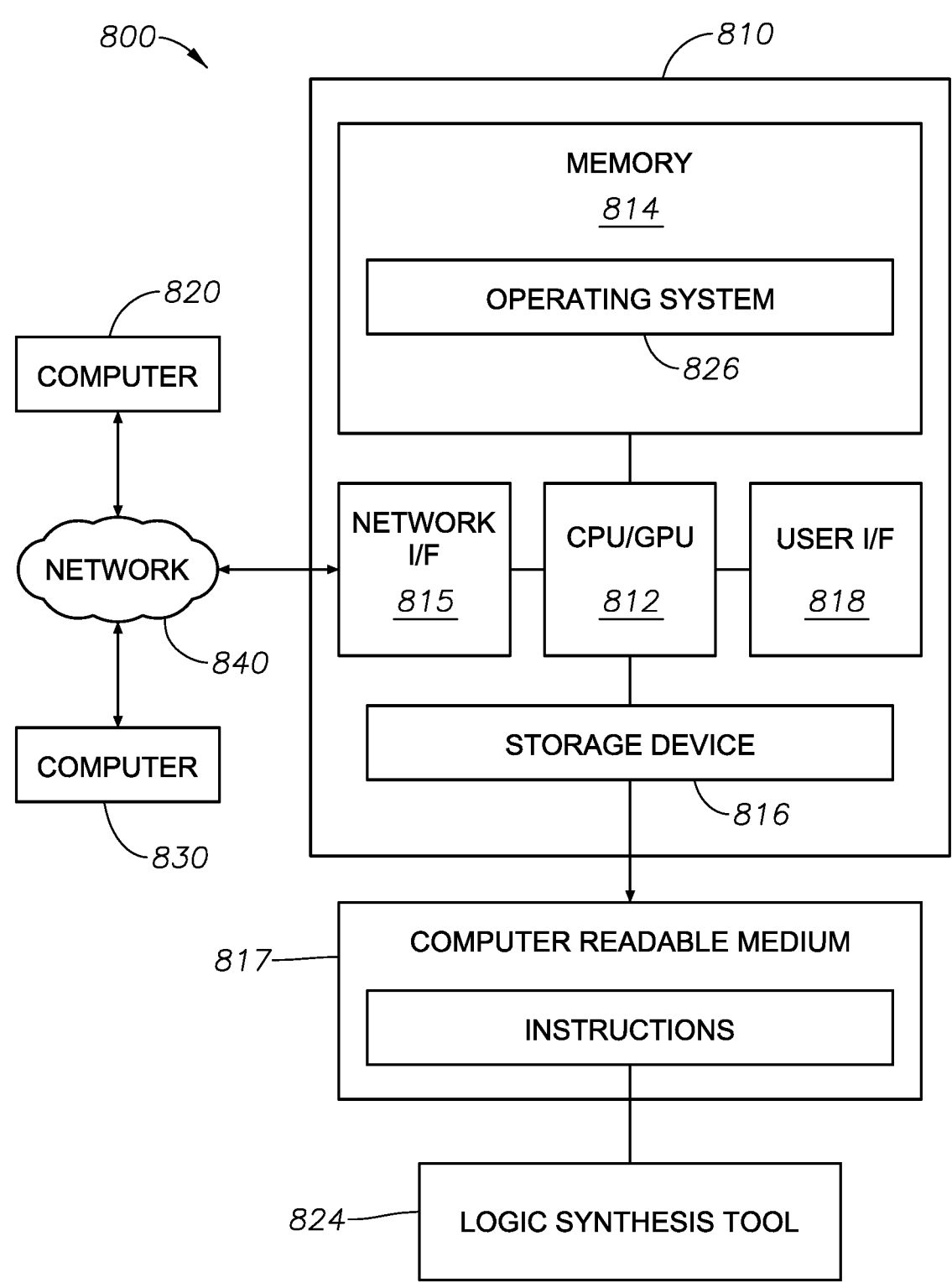
FIG. 8 is a block diagram in accordance with various implementations described herein.

FIG. 8 illustrates example hardware components in the computer system 800 that may be used for power prediction of a compute unit of a compute unit (i.e., processing unit) based on the predictive power signal (e.g., predicted power signal 250; differential power signal 240). In certain implementations, the example computer system 800 (e.g., networked computer system and/or server) may include a logic synthesis tool 824 (e.g., electronic design automation tool (EDA) tool) and execute software based on the procedure as described with reference to the method 600 and 700 with reference to FIGS. 6 and 7. In certain implementations, the logic synthesis tool 824 may be included as a feature of an existing memory compiler software program allowing user input of predetermined training interval range or other criteria as described herein.

The logic synthesis tool 824 may provide generated computer-aided physical layout designs for memory architecture. The procedure 600 and 700 may be stored as program code as instructions 817 in the computer readable medium of the storage device 816 (or alternatively, in memory 814) that may be executed by the computer 810, or networked computers 820, 830, other networked electronic devices (not shown) or a combination thereof. In certain implementations, each of the computers 810, 820, 830 may be any type of computer, computer system, or other programmable electronic device. Further, each of the computers 810, 820, 830 may be implemented using one or more networked computers, e.g., in a cluster or other distributed computing system.

In certain implementations, the system 800 may be used with semiconductor integrated circuit (IC) designs that contain all standard cells, all blocks or a mixture of standard cells and blocks. In a particular example implementation, the system 800 may include in its database structures: a collection of cell libraries, one or more technology files, a plurality of cell library format files, a set of top design format files, one or more Open Artwork System Interchange Standard (OASIS/ OASIS.MASK) files, and/or at least one EDIF file. The database of the system 810 may be stored in one or more of memory 814 or storage devices 816 of computer 810 or in networked computers 820, 830.

The system 800 may perform the following functions automatically, with variable user input: logical synthesis; timing and power optimization; clock tree generation; identification of logic designs (i.e., periphery circuit designs (i.e., logic threshold voltages, threshold voltage implant layers)), determination of a desired threshold voltage- combination, determination of minimum voltage assist requirements, identification of bit-cell types, determination of memory specific optimization modes (memory optimization mode), floor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 800 to produce the target results that are required by a designer. In certain implementations, the system 800 may also provide for the capability to manually perform functions such as: cell region creation, block placement, pad and cell placement (before and after automatic placement), net routing before and after automatic routing and layout editing. Moreover, verification functions included in the system 800 may be used to determine the integrity of a design after, for example, manual editing, design rule checking (DRC) and layout versus schematic comparison (LVS).

In one implementation, the computer 800 includes a central processing unit (CPU) 812 having at least one hardware-based processor coupled to a memory 814. The memory 814 may represent random access memory (RAM) devices of main storage of the computer 810, supplemental levels of memory (e.g., cache memories, non-volatile or backup memories (e.g., programmable or flash memories)), read-only memories, or combinations thereof. In addition to the memory 814, the computer system 800 may include other memory located elsewhere in the computer 810, such as cache memory in the CPU 812, as well as any storage capacity used as a virtual memory (e.g., as stored on a storage device 816 or on another computer coupled to the computer 810).

The computer 810 may further be configured to communicate information externally. To interface with a user or operator (e.g., a circuit design engineer), the computer 810 may include a user interface (I/F) 818 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 810 may include a network interface (I/F) 815 which may be coupled to one or more networks 840 (e.g., a wireless network) to enable communication of information with other computers and electronic devices. The computer 860 may include analog and/or digital interfaces between the CPU 812 and each of the components 814, 815, 816, and 818. Further, other non-limiting hardware environments may be used within the context of example implementations.

The computer 810 may operate under the control of an operating system 826 and may execute or otherwise rely upon various computer software applications, components, programs, objects, modules, data structures, etc. (such as the programs associated with the procedures 600, 700 and related software). The operating system 826 may be stored in the memory 814. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/OS® (a registered trademark of IBM Corp.), and others as will occur to those of skill in the art. The operating system 826 in the example of FIG. 8 is shown in the memory 814, but components of the aforementioned software may also, or in addition, be stored at non-volatile memory (e.g., on storage device 816 (data storage) and/or the non-volatile memory (not shown). Moreover, various applications, components, programs, objects, modules, etc. may also execute on one or more processors in another computer coupled to the computer 810 via the network 840 (e.g., in a distributed or client-server computing environment) where the processing to implement the functions of a computer program may be allocated to multiple computers 820, 830 over the network 840.

In example implementations, circuit macro diagrams have been provided in FIGS. 1-8, whose redundant description has not been duplicated in the related description of analogous circuit macro diagrams. It is expressly incorporated that the same cell layout diagrams with identical symbols and/or reference numerals are included in each of embodiments based on its corresponding figure(s).

Although one or more of FIGS. 1-8 may illustrate systems, apparatuses, or methods according to the teachings of the disclosure, the disclosure is not limited to these illustrated systems, apparatuses, or methods. One or more functions or components of any of FIGS. 1-8 as illustrated or described herein may be combined with one or more other portions of another of FIGS. 1-8. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 814, the storage device 816, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A method comprising:
receiving, by a hardware design generation circuit, a plurality of input signals of a software workload on a processing unit;
training a power prediction model based on a toggling of the input signals accumulated over a training interval range;
determining, by the hardware design generation circuit, a plurality of prediction proxies and respective weightings for the plurality of prediction proxies based at least partially on the trained power prediction model;
generating, by the hardware design generation circuit, a power output; and
generating an updated circuit design of the processing unit based on the power output.

2. The method of claim 1, wherein the power prediction model is trained by a power simulation of the processing unit.

3. The method of claim 1, wherein the updated circuit design is generated by a synthesis tool of a computing device.

4. The method of claim 1, further comprising:
generating, by a computation differentiation circuitry, a differential power output based on the power output, wherein the differential power output corresponds to a rate of change of the power output.

5. The method of claim 4, further comprising:
generating, by a synthesis tool, the updated circuit design based on the differential power output.

6. The method of claim 1, wherein the software workload simulation is designed to generate power output of a plurality of register-transfer level (RTL) signals in simulation, and wherein the plurality of RTL signals corresponds to the input data signals, and wherein the plurality of weighted prediction proxies correspond to a power output of the hardware design generation circuit.

7. The method of claim 1, wherein the training interval range comprises a range of one or more clock cycles of a power simulation of the processing unit.

8. The method of claim 1, wherein training the power prediction model, by executing instructions corresponding to a power prediction modeling software stored on a computing device, comprises:
generating respective toggle data signals, by one or more toggle generators of the hardware design generation circuit, from the input signals, wherein the input signals correspond to a plurality of register-transfer level (RTL) signals in simulation; and
toggling, by the one or more toggle generators of the hardware design generation circuit, the toggle data signals at each clock cycle of the training interval range.

9. The method of claim 8, wherein determining the plurality of prediction proxies and the respective weightings of the plurality of prediction proxies, by executing the instructions corresponding to the power prediction modeling software stored on the computing device, comprise:
combining or not combining, by respective multiplexers and an adder, the toggled data signals based on a set of trainable weight values over the training interval range;
identifying, by the power prediction model, a subset of the of the plurality of RTL signals comprising non-zero weight terms, wherein the subset of the of the plurality of RTL signals correspond to a plurality of candidate prediction proxies;
toggling the plurality of candidate prediction proxies; and
combining or not combining, by the respective multiplexers and the adder, the plurality of candidate prediction proxies based on a second set of trainable weight values over each clock cycle of the training interval range.

10. The method of claim 9, wherein the toggled data signals are combined or not combined based on a correlation of predicted power being above a predicted power threshold, and wherein the plurality of candidate prediction proxies are combined or not combined based on a correlation of the prediction proxies being above a proxy threshold.

11. The method of claim 1, wherein training the power prediction model is based on one or more of a combination of a minimax concave penalty (MCP) algorithm, a pruning training model, a loss function equation, or a sparce linear model.

12. The method of claim 1, wherein the toggling of the input signals in a first clock cycle and respective power consumption is used as ground truth to train the power prediction model.

* * * * *